(12) United States Patent
Wang et al.

(10) Patent No.: US 12,125,642 B2
(45) Date of Patent: Oct. 22, 2024

(54) METHOD OF MANUFACTURING CAPACITOR STRUCTURE

(71) Applicant: NANYA TECHNOLOGY CORPORATION, New Taipei (TW)

(72) Inventors: Chien-Chung Wang, New Taipei (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/193,653

(22) Filed: Mar. 31, 2023

(65) Prior Publication Data

US 2023/0245826 A1 Aug. 3, 2023

Related U.S. Application Data

(62) Division of application No. 17/242,327, filed on Apr. 28, 2021, now Pat. No. 11,651,896.

(51) Int. Cl.
| | |
|---|---|
| *H10B 12/00* | (2023.01) |
| *H01G 4/228* | (2006.01) |
| *H01G 13/00* | (2013.01) |
| *H01L 29/94* | (2006.01) |
| *H01L 49/02* | (2006.01) |

(52) U.S. Cl.
CPC ............. *H01G 4/228* (2013.01); *H01G 13/00* (2013.01); *H01L 28/91* (2013.01); *H01L 28/92* (2013.01); *H01L 29/945* (2013.01); *H10B 12/038* (2023.02); *H10B 12/37* (2023.02); *H10B 12/39* (2023.02)

(58) Field of Classification Search
CPC ......... H01L 28/90; H01L 28/91; H01L 28/92; H10B 12/03–0387
See application file for complete search history.

(56) References Cited

U.S. PATENT DOCUMENTS

| | | | |
|---|---|---|---|
| 5,266,512 A | 11/1993 | Kirsch | |
| 6,383,863 B1 * | 5/2002 | Chiang | ................. H10B 12/033 257/E21.018 |
| 9,991,333 B1 | 6/2018 | Liu et al. | |
| 10,861,858 B2 | 12/2020 | Lee et al. | |
| 2004/0036051 A1 | 2/2004 | Sneh | |
| 2020/0219891 A1 * | 7/2020 | Lee | ......................... H10B 10/12 |

* cited by examiner

*Primary Examiner* — Jesse Y Miyoshi
(74) *Attorney, Agent, or Firm* — CKC & Partners Co., LLC

(57) ABSTRACT

A method of manufacturing a capacitor structure includes the following. A first, second, third, fourth, fifth, sixth and seventh portions of a contact layer arrange from periphery to center. A first-conductive layer contacting the first portion forms in an opening. A first-dielectric layer contacting the second portion forms on the first-conductive layer. A second-conductive layer forms on the first-dielectric layer. A second-dielectric layer contacting the third portion forms on the second-conductive layer. A third-conductive layer contacting the fourth portion forms on the second-dielectric layer. A third-dielectric layer contacting the fifth portion forms on the third-conductive layer. A fourth-conductive layer contacting the second-conductive layer forms on the third-dielectric layer. A fourth-dielectric layer contacting the sixth portion forms on the fourth-conductive layer. A fifth-conductive layer contacting the seventh portion forms on the fourth-dielectric layer. A fifth-dielectric layer forms on the fourth-dielectric layer and the fifth-conductive layer.

8 Claims, 18 Drawing Sheets

METHOD OF MANUFACTURING CAPACITOR STRUCTURE

CROSS-REFERENCE TO RELATED APPLICATION

The present application is a Divisional Application of the U.S. application Ser. No. 17/242,327, filed Apr. 28, 2021, which is herein incorporated by reference in its entirety.

BACKGROUND

Field of Invention

The present disclosure relates to a method of manufacturing a capacitor structure.

Description of Related Art

As the dynamic random access memory (DRAM) process shrink to smaller size or next generation (e.g., reduce a capacitor area), it is difficult about the capacitor process. It is also difficult to increase the capacitance value for compensating leakage. Therefore, how to increase the capacitance value of the capacitor has become a technical issue to be solved in this field.

SUMMARY

The present disclosure provides a method of manufacturing a single-sided capacitor structure with parallel connection, which has great capacitance value.

In accordance with an aspect of the present disclosure, a method of manufacturing a capacitor structure includes: forming a first conductive layer on a side surface of an opening exposing a contact layer, in which the first conductive layer is in contact with a first portion of the contact layer; forming a first dielectric layer on an upper surface of the first conductive layer and a side surface thereof and in contact with a second portion of the contact layer, and forming a second conductive layer on an upper surface of the first dielectric layer and a side surface thereof, in which the second conductive layer and the contact layer are separated by the first dielectric layer; forming a second dielectric layer on a side surface of the second conductive layer and in contact with a third portion of the contact layer, in which the second dielectric layer is connected to the first dielectric layer; forming a third conductive layer on a side surface of the second dielectric layer and in contact with a fourth portion of the contact layer, in which the third conductive layer has a height less than a height of the second dielectric layer; forming a third dielectric layer on an upper surface of the third conductive layer and a side surface thereof and in contact with a fifth portion of the contact layer, and forming a fourth conductive layer on an upper surface of the third dielectric layer and a side surface thereof and in contact with the second conductive layer, in which the third dielectric layer is connected to the second dielectric layer, and the fourth conductive layer and the contact layer are separated by the third dielectric layer; forming a fourth dielectric layer on a side surface of the fourth conductive layer and in contact with a sixth portion of the contact layer, in which the fourth dielectric layer is connected to the third dielectric layer; forming a fifth conductive layer on a side surface of the fourth dielectric layer and in contact with a seventh portion of the contact layer; and forming a fifth dielectric layer on an upper surface of the fourth dielectric layer and an upper surface of the fifth conductive layer, in which the fifth dielectric layer is connected to the fourth dielectric layer, in which the first, second, third, fourth, fifth, sixth and seventh portions of the contact layer are arranged from periphery to center.

According to some embodiments of the present disclosure, forming the first dielectric layer and the second conductive layer includes: sequentially and conformally forming a first dielectric material layer and a second conductive material layer in the opening and on the first conductive layer; and removing a portion of the second conductive material layer and a portion of the first dielectric material layer therebeneath to form the first dielectric layer and the second conductive layer.

According to some embodiments of the present disclosure, forming the third conductive layer includes: conformally forming a third conductive material layer on the second dielectric layer and the second conductive layer; performing a polishing process on the third conductive material layer to expose an upper surface of the second dielectric layer and an upper surface of the second conductive layer; and removing a plurality of portions of the third conductive material layer to form the third conductive layer having the height less than the height of the second dielectric layer.

According to some embodiments of the present disclosure, forming the third dielectric layer and the fourth conductive layer includes: conformally forming a third dielectric material layer on the third conductive layer, the second dielectric layer and the second conductive layer; performing a polishing process on the third dielectric material layer to expose an upper surface of the second dielectric layer and an upper surface of the second conductive layer; conformally forming a fourth conductive material layer on the third dielectric material layer after performing the polishing process; and removing a portion of the fourth conductive material layer and a portion of the third dielectric material layer therebeneath to form the third dielectric layer and the fourth conductive layer.

According to some embodiments of the present disclosure, the method further includes: forming a semiconductor layer over the fourth conductive layer and the fifth dielectric layer; and forming a metal-containing layer over the semiconductor layer.

According to some embodiments of the present disclosure, the fifth conductive layer has a height substantially equal to a height of the fourth conductive layer.

According to some embodiments of the present disclosure, the fifth conductive layer has a height greater than a height of the third conductive layer.

According to some embodiments of the present disclosure, the third conductive layer has a height greater than a height of the first conductive layer.

In accordance with another aspect of the present disclosure, a capacitor structure includes a contact layer, an insulating layer, a bottom conductive plate, a dielectric layer and a top conductive plate. The contact layer having first, second, third, fourth and fifth portions arranged from periphery to center. The insulating layer is disposed over the contact layer and has an opening exposing the contact layer. The bottom conductive plate is disposed in the opening and includes first, second and third portions extending along a depth direction of the opening and separated from each other and in contact with the first, third and fifth portions of the contact layer, respectively. The dielectric layer is conformally disposed on the bottom conductive plate and in contact with the second and fourth portions of the contact layer. The top conductive plate is disposed on the dielectric layer.

According to some embodiments of the present disclosure, the dielectric layer is in contact with upper surfaces and side surfaces of the first, second and third portions of the bottom conductive plate.

According to some embodiments of the present disclosure, the top conductive plate includes first and second portions extending along the depth direction of the opening and toward the second and fourth portions of the contact layer, respectively.

According to some embodiments of the present disclosure, the third portion of the bottom conductive plate has a height greater than a height of the second portion of the bottom conductive plate.

According to some embodiments of the present disclosure, the second portion of the bottom conductive plate has a height greater than a height of the first portion of the bottom conductive plate.

According to some embodiments of the present disclosure, the third portion of the bottom conductive plate has a height substantially equal to a height of the top conductive plate.

According to some embodiments of the present disclosure, the capacitor structure further includes a conductive layer over the top conductive plate, in which the dielectric layer on the third portion of the bottom conductive plate is embedded in the conductive layer.

According to some embodiments of the present disclosure, the conductive layer includes a semiconductor layer and a metal-containing layer on the semiconductor layer, and the dielectric layer on the third portion of the bottom conductive plate is embedded in the semiconductor layer.

According to some embodiments of the present disclosure, the dielectric layer is wave-shaped in cross-section.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In order that the present disclosure is described in detail and completeness, implementation aspects and specific embodiments of the present disclosure with illustrative description are presented, but it is not the only form for implementation or use of the specific embodiments of the present disclosure. The embodiments disclosed herein may be combined or substituted with each other in an advantageous manner, and other embodiments may be added to an embodiment without further description. In the following description, numerous specific details will be described in detail in order to enable the reader to fully understand the following embodiments. However, the embodiments of the present disclosure may be practiced without these specific details.

Further, spatially relative terms, such as "beneath," "over," and the like, may be used herein for ease of description to describe one element or feature's relationship to another element(s) or feature(s) as shown in the figures. The true meaning of the spatially relative terms includes other orientations. For example, when the figure is flipped up and down by 180 degrees, the relationship between one component and another component may change from "beneath" to "over." In addition, the spatially relative descriptions used herein should be interpreted the same.

As mentioned in the related art, how to increase the capacitance value of the capacitor has become a technical issue to be solved in this field. Therefore, the present disclosure provides a method of manufacturing a single-sided capacitor structure with parallel connection to increase the capacitance value. Various embodiments of the method of manufacturing the capacitor structure will be described below.

Figure 1:
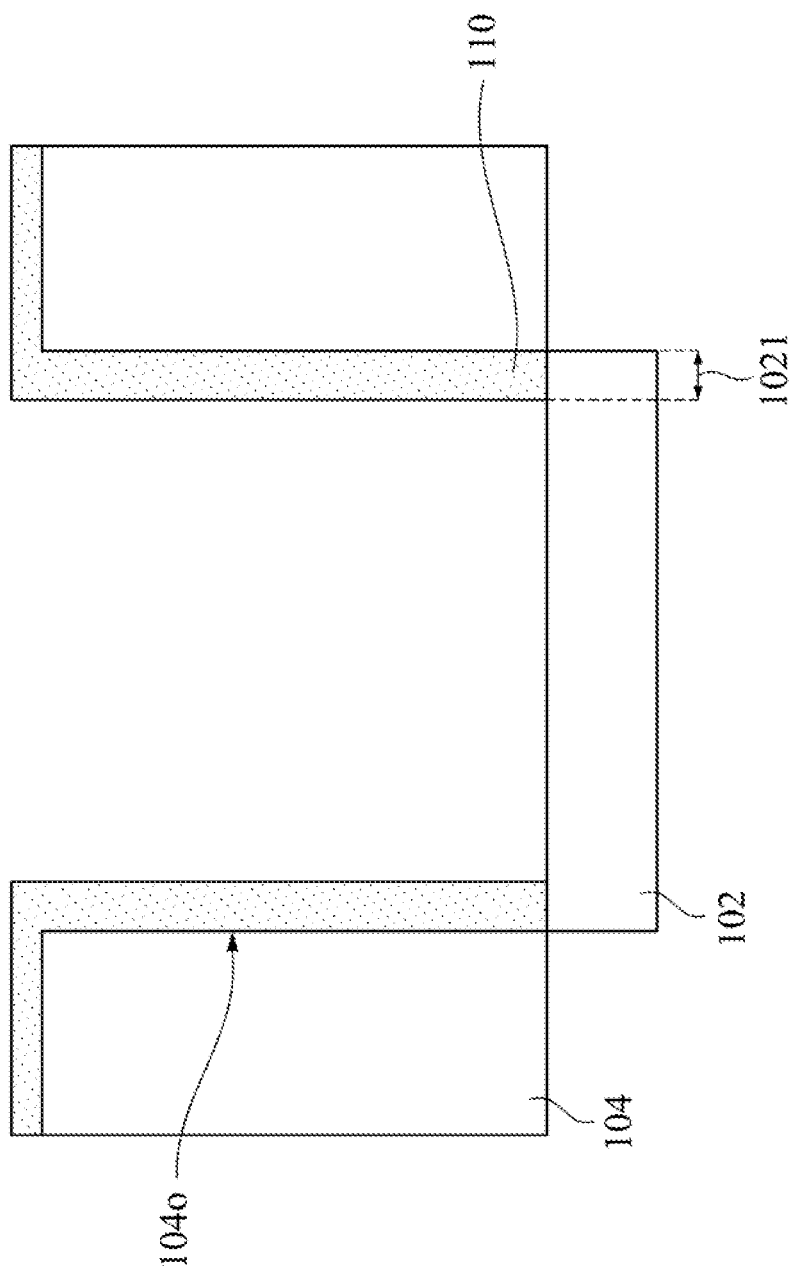
FIGS. 1-17 are cross-sectional views of a method of manufacturing a capacitor structure at various stages in accordance with some embodiments of the present disclosure.

FIGS. 1-17 are cross-sectional views of a method of manufacturing a capacitor structure at various stages in accordance with some embodiments of the present disclosure. As shown in FIG. 1, an insulating layer 104 is formed on a contact layer 102, and the insulating layer 104 has an opening 104o exposing the contact layer 102. In some embodiments, the shape of the opening 104o in a top view is circular, elliptical or any other suitable shape.

As shown in FIG. 1, a first conductive layer 110 is formed on a side surface of the opening 104o exposing the contact layer 102. The first conductive layer 110 is in contact with a first portion 1021 of the contact layer 102. The first portion 1021 is adjacent to the corner of the opening 104o. In some embodiments, a first conductive material layer (not shown) is conformally formed in the opening 104o, and photolithographic and etching processes are then performed on the first conductive material layer to form the first conductive layer 110.

Figure 2:
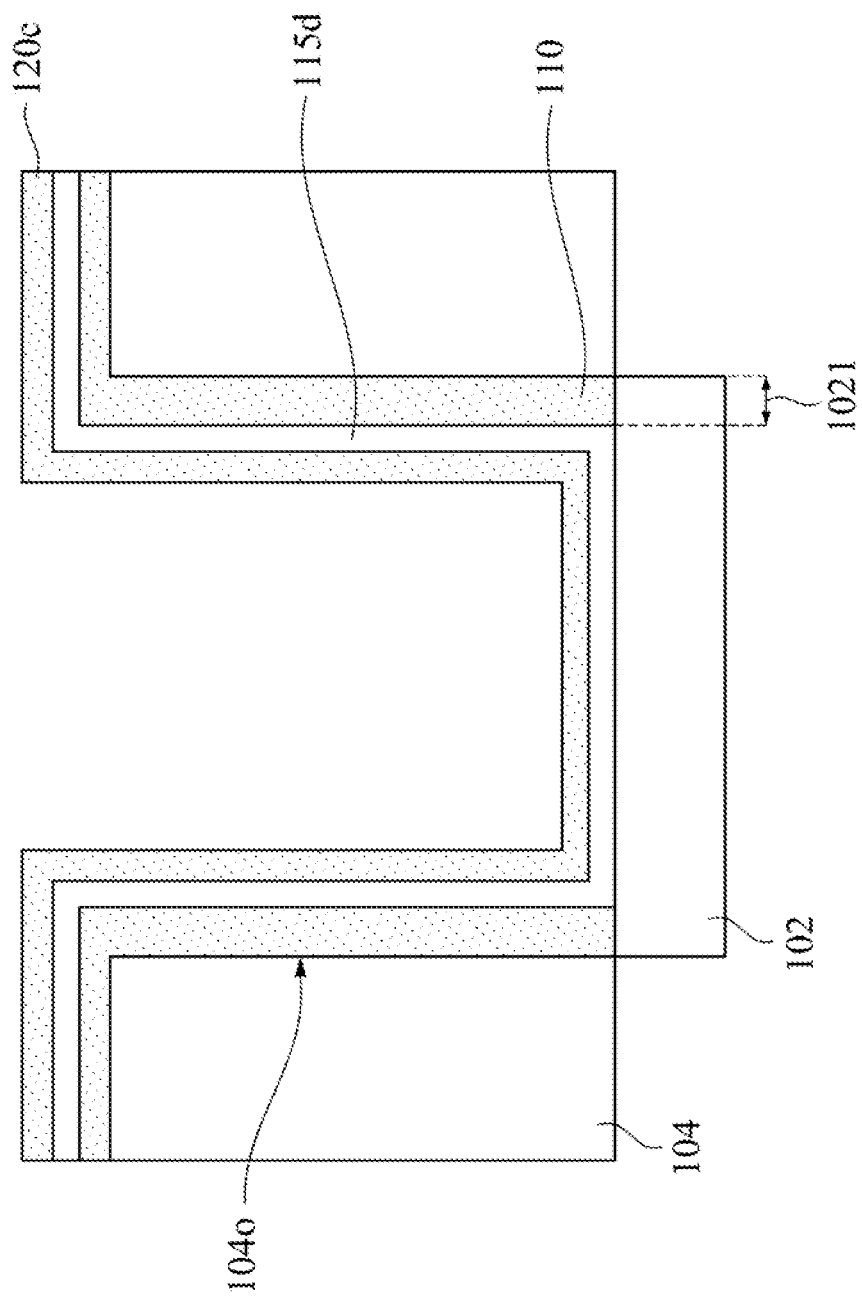
Figure 3:
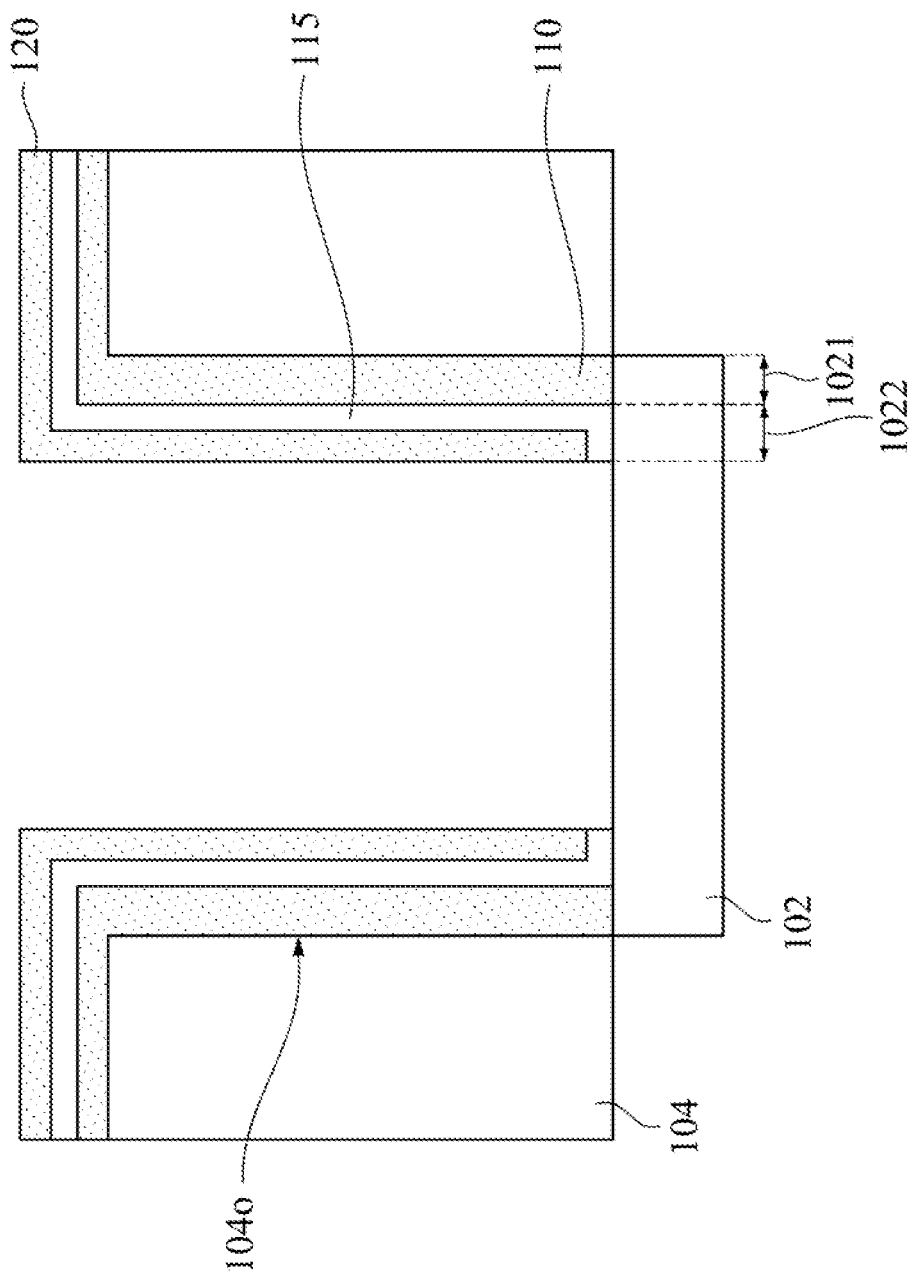

As shown in FIGS. 1-3, a first dielectric layer 115 and a second conductive layer 120 are formed on the first conductive layer 110. Specifically, as shown in FIG. 3, the first dielectric layer 115 is formed on an upper surface of the first conductive layer 110 and a side surface thereof and in contact with a second portion 1022 of the contact layer 102. The second portion 1022 is adjacent to the first portion 1021. The second conductive layer 120 is formed on an upper surface of the first dielectric layer 115 and a side surface thereof. The second conductive layer 120 and the contact layer 102 are separated by the first dielectric layer 115.

In some embodiments, forming the first dielectric layer 115 and the second conductive layer 120 includes: sequentially and conformally forming a first dielectric material layer 115d and a second conductive material layer 120c in the opening 104a and on the first conductive layer 110, as shown in FIGS. 1 and 2; and removing a portion of the second conductive material layer 120c and a portion of the first dielectric material layer 115d therebeneath (e.g., by performing photolithographic and etching processes) to form the first dielectric layer 115 and the second conductive layer 120, as shown in FIGS. 2 and 3.

Figure 4:
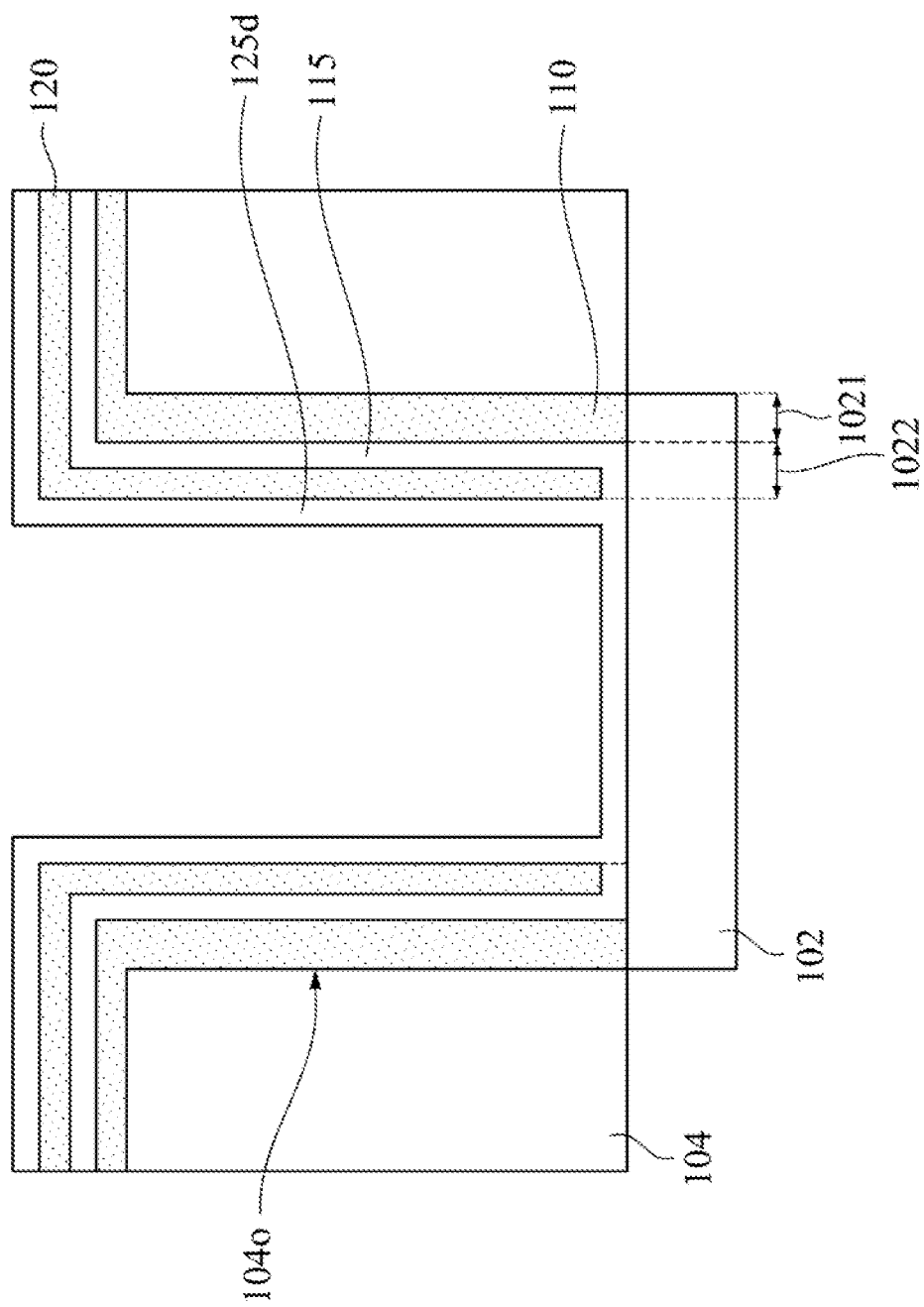
Figure 5:
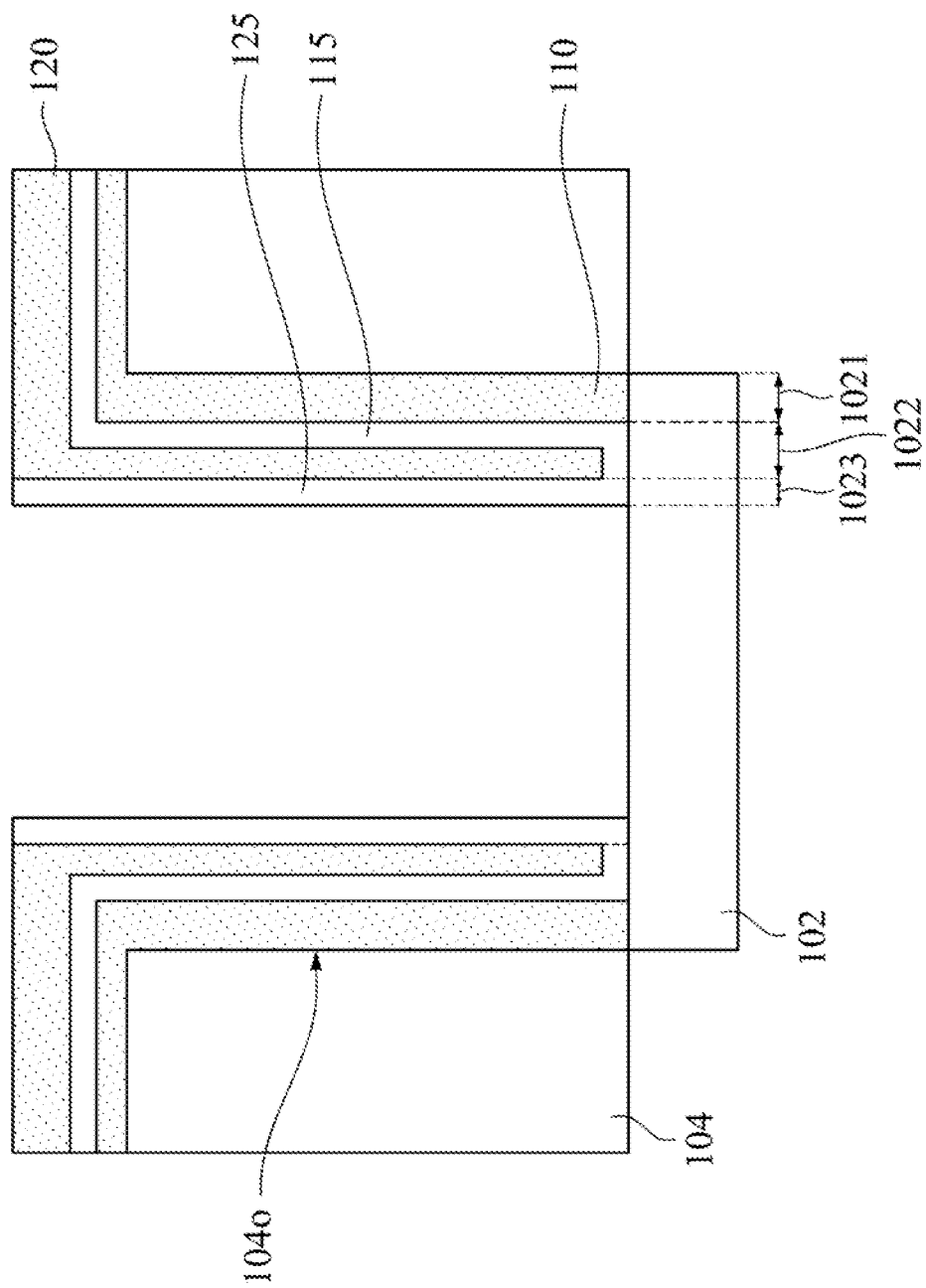

As shown in FIGS. 3-5, a second dielectric layer 125 is formed on a side surface of the second conductive layer 120 and in contact with a third portion 1023 of the contact layer

102. The third portion 1023 is adjacent to the second portion 1022. The second dielectric layer 125 is connected to the first dielectric layer 115.

In some embodiments, forming the second dielectric layer 125 includes: conformally forming a second dielectric material layer 125*d* on the second conductive layer 120, as shown in FIGS. 3 and 4; and removing a plurality portions of the second dielectric material layer 125*d* to form the second dielectric layer 125, as shown in FIGS. 4 and 5. In some embodiments, after the second dielectric material layer 125*d* is formed, a photoresist (not shown) is conformally formed on the second dielectric material layer 125*d*, and an anisotropic etching process in a direction perpendicular to the plane of the contact layer 102 is performed to remove the portions of the second dielectric material layer 125*d* to form the second dielectric layer 125.

Figure 6:
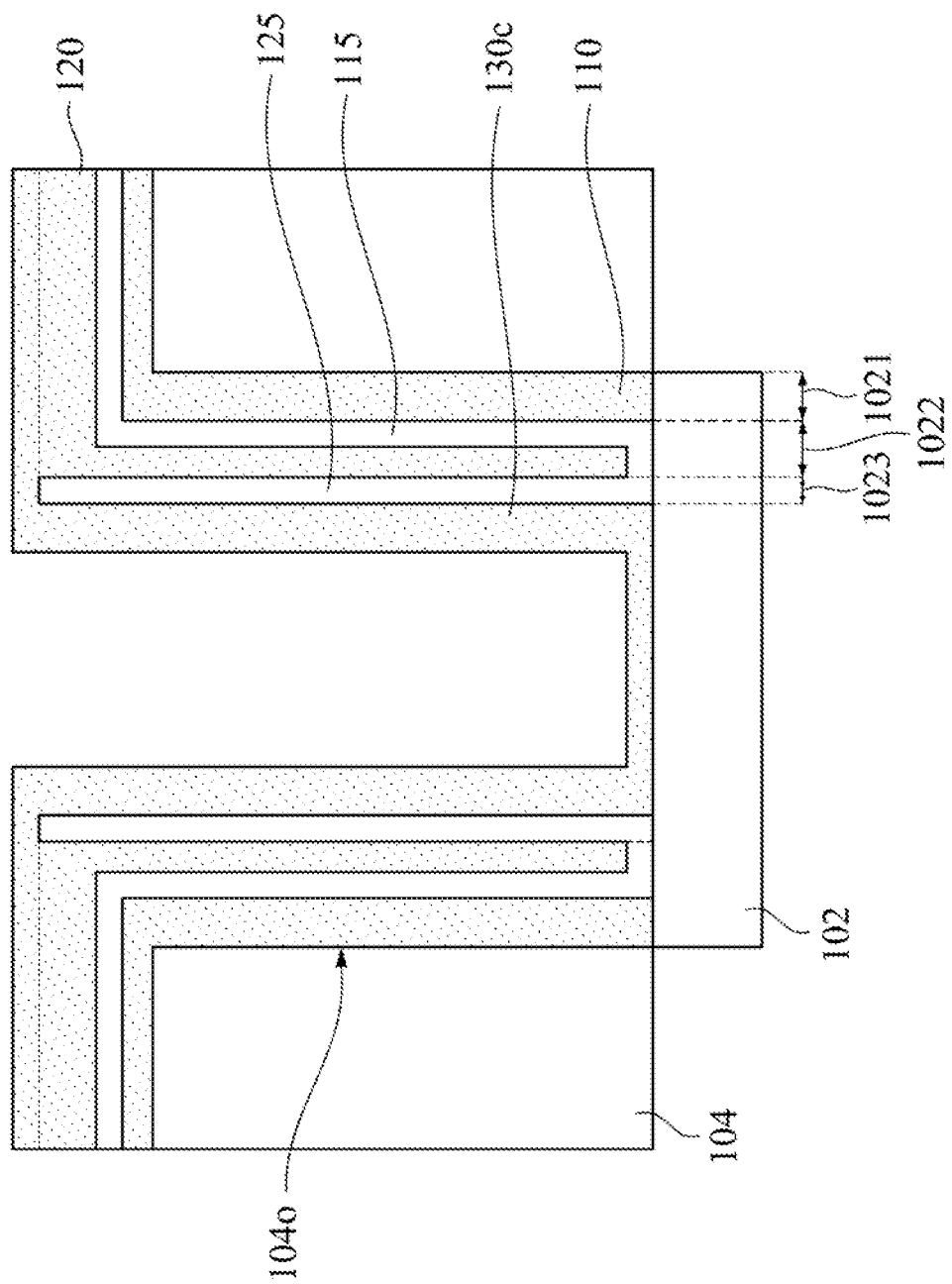
Figure 7:
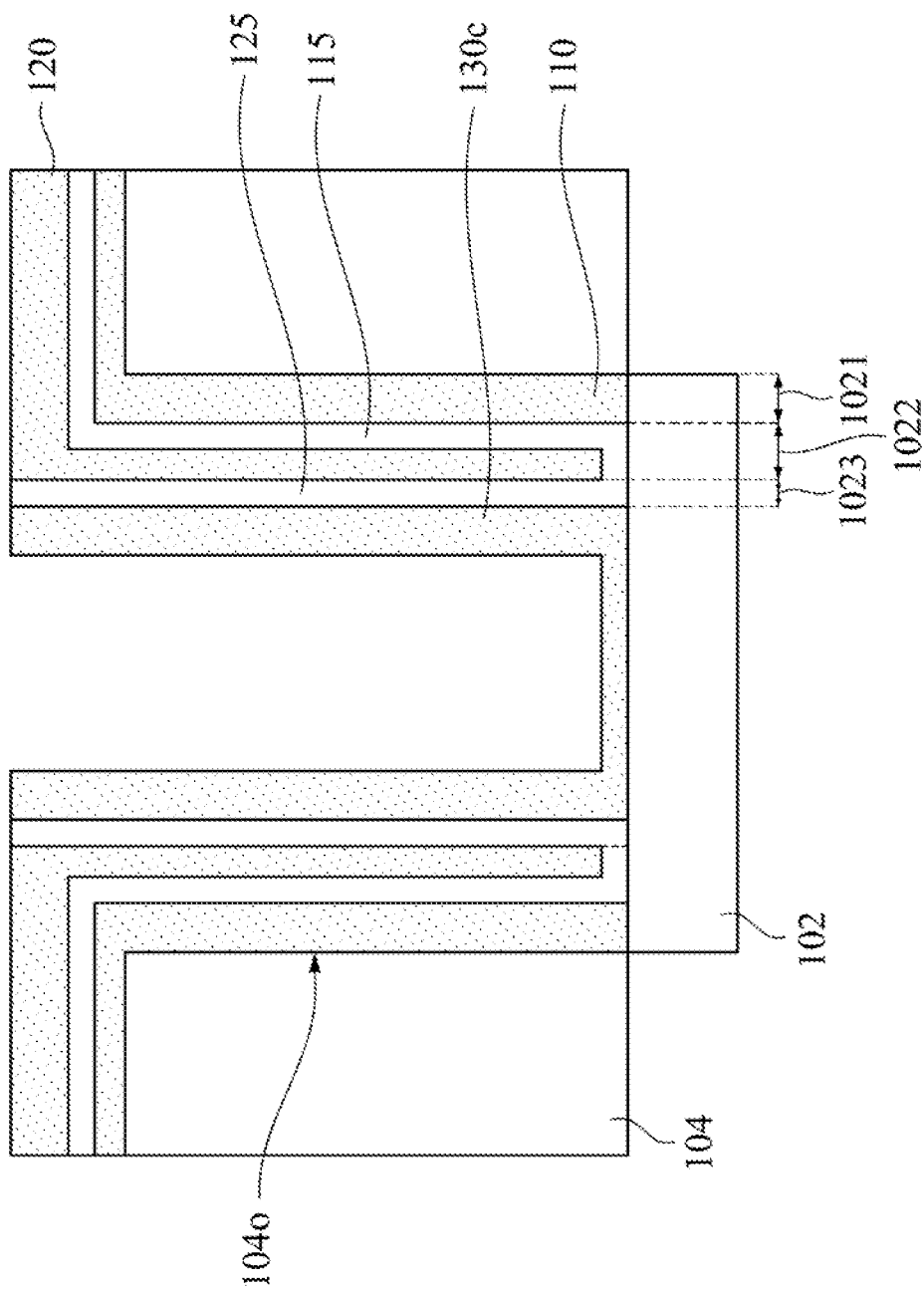
Figure 8:
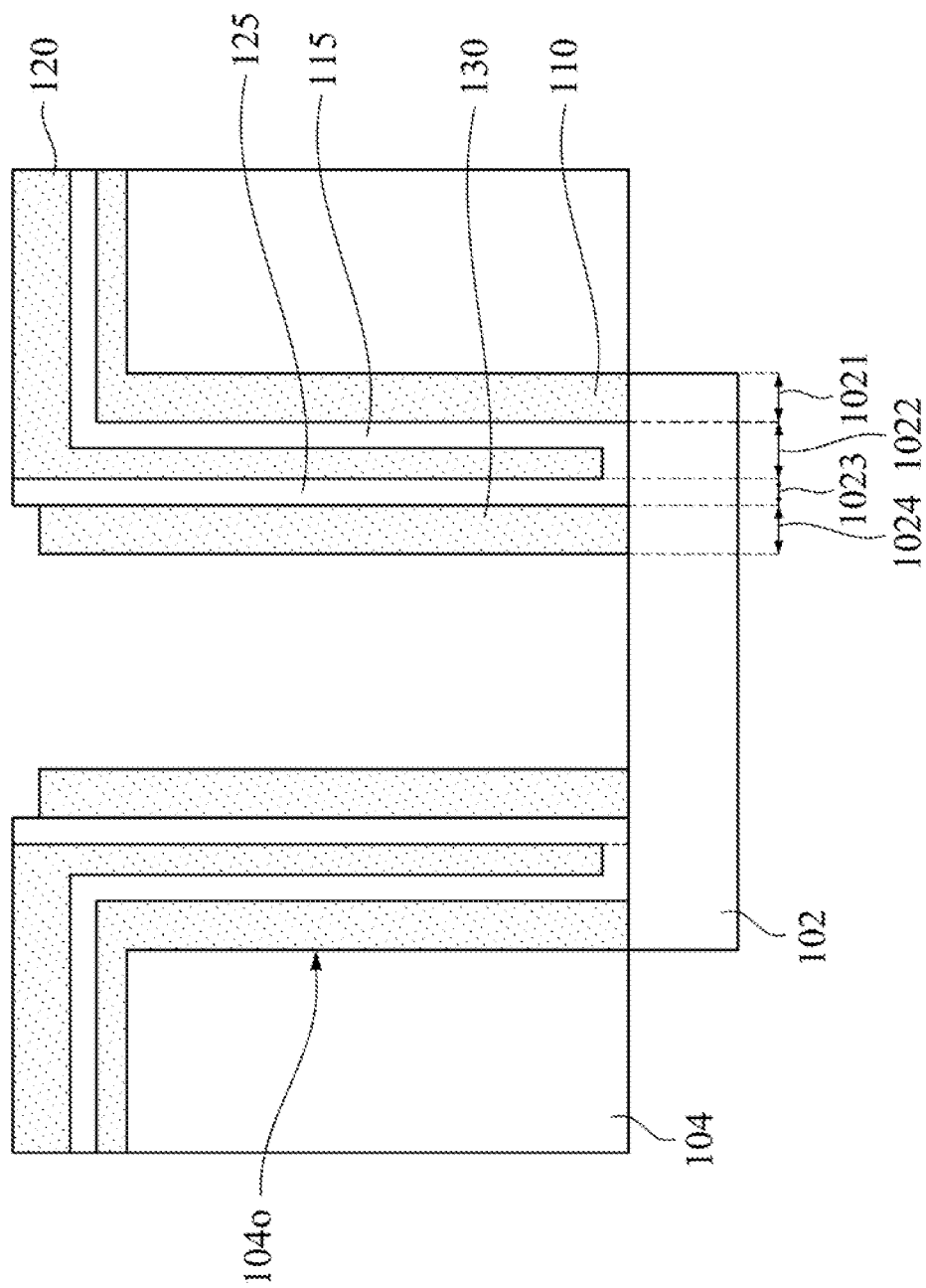

As shown in FIGS. 5-8, a third conductive layer 130 is formed on a side surface of the second dielectric layer 125 and in contact with a fourth portion 1024 of the contact layer 102. The fourth portion 1024 is adjacent to the third portion 1023. As shown in FIG. 8, the third conductive layer 130 has a height less than a height of the second dielectric layer 125. In some embodiments, the third conductive layer 130 has a height greater than a height of the first conductive layer 110.

In some embodiments, forming the third conductive layer 130 includes: conformally forming a third conductive material layer 130*c* on the second dielectric layer 125 and the second conductive layer 120, as shown in FIGS. 5 and 6; performing a polishing process on the third conductive material layer 130*c* to expose an upper surface of the second dielectric layer 125 and an upper surface of the second conductive layer 120, as shown in FIGS. 6 and 7; and removing a plurality of portions of the third conductive material layer 130*c* to form the third conductive layer 130, as shown in FIGS. 7 and 8. In some embodiments, as shown in FIGS. 7 and 8, after the polishing process is performed, a patterned photoresist (not shown) is formed covering the second dielectric layer 125 and the second conductive layer 120 and exposing the third conductive material layer 130*c*, and an anisotropic etching process in a direction perpendicular to the plane of the contact layer 102 is performed to remove the portions of the third conductive material layer 130*c* to form the third conductive layer 130.

Figure 10:
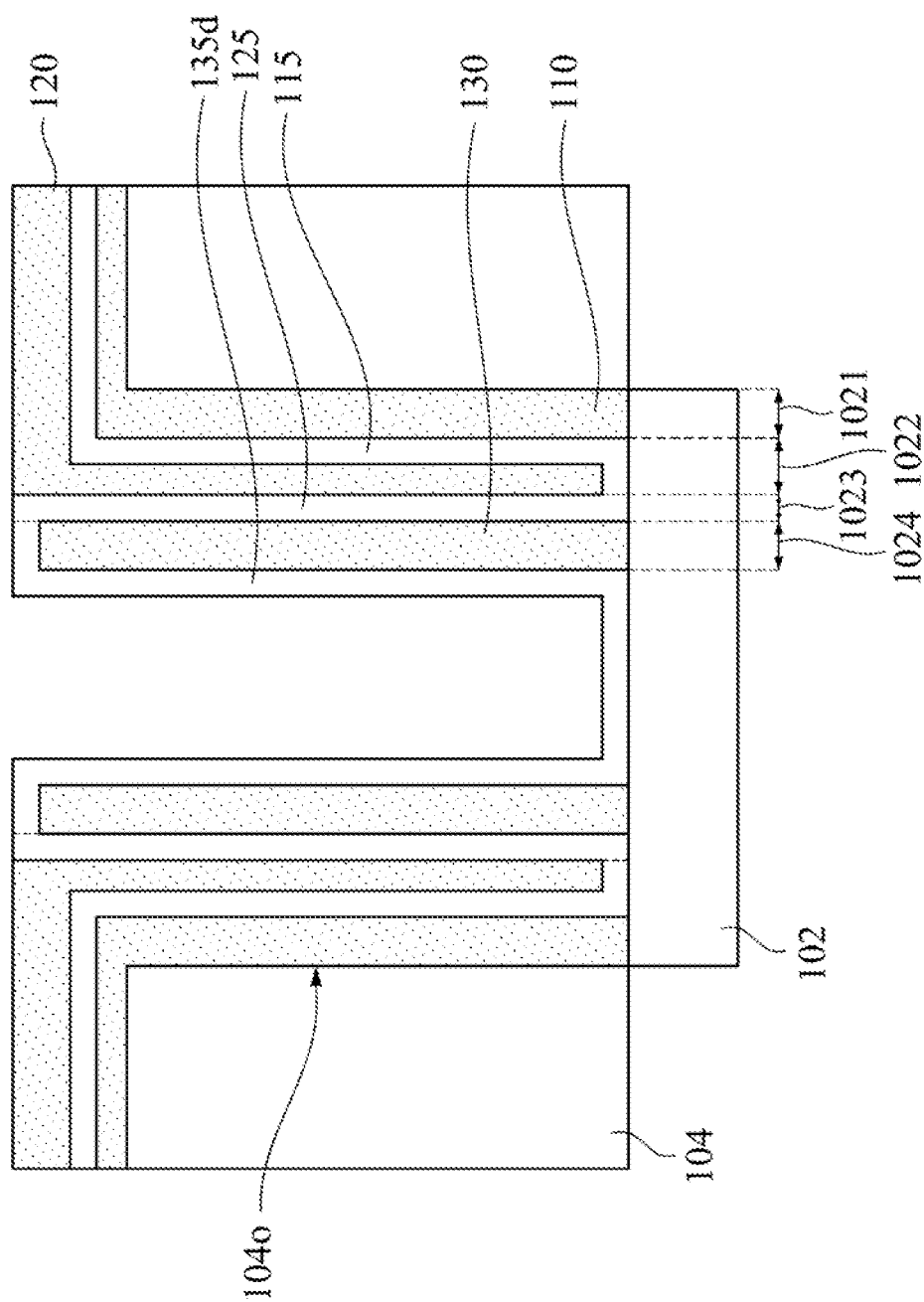
Figure 11:
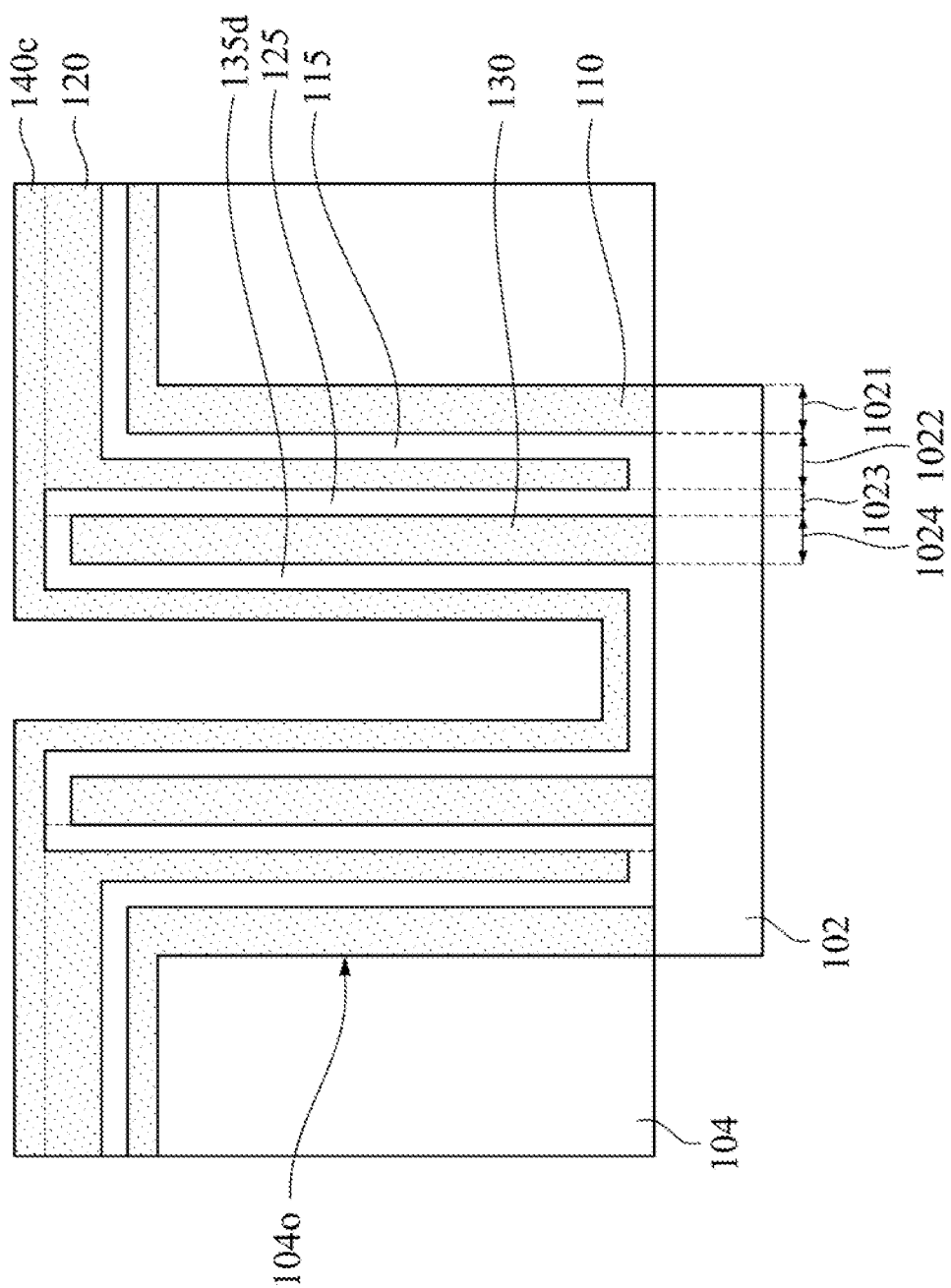
Figure 12:
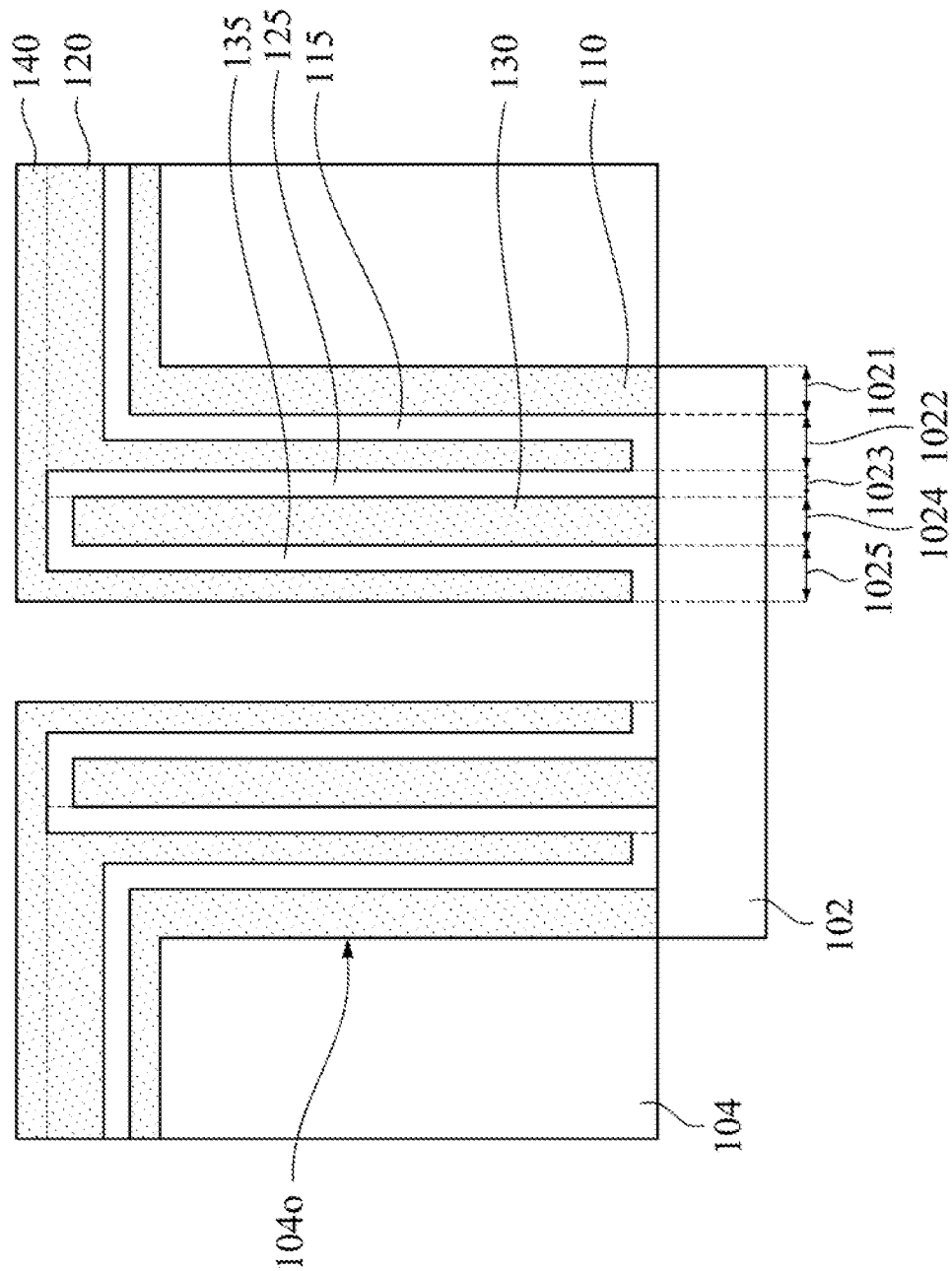

As shown in FIGS. 8-12, a third dielectric layer 135 and a fourth conductive layer 140 are formed on the third conductive layer 130. Specifically, as shown in FIGS. 12, the third dielectric layer 135 is formed on an upper surface of the third conductive layer 130 and a side surface thereof and in contact with a fifth portion 1025 of the contact layer 102. The fifth portion 1025 is adjacent to the fourth portion 1024. The third dielectric layer 135 is connected to the second dielectric layer 125. The fourth conductive layer 140 is formed on an upper surface of the third dielectric layer 135 and a side surface thereof and in contact with the second conductive layer 120. The fourth conductive layer 140 and the contact layer 102 are separated by the third dielectric layer 135.

Figure 9:
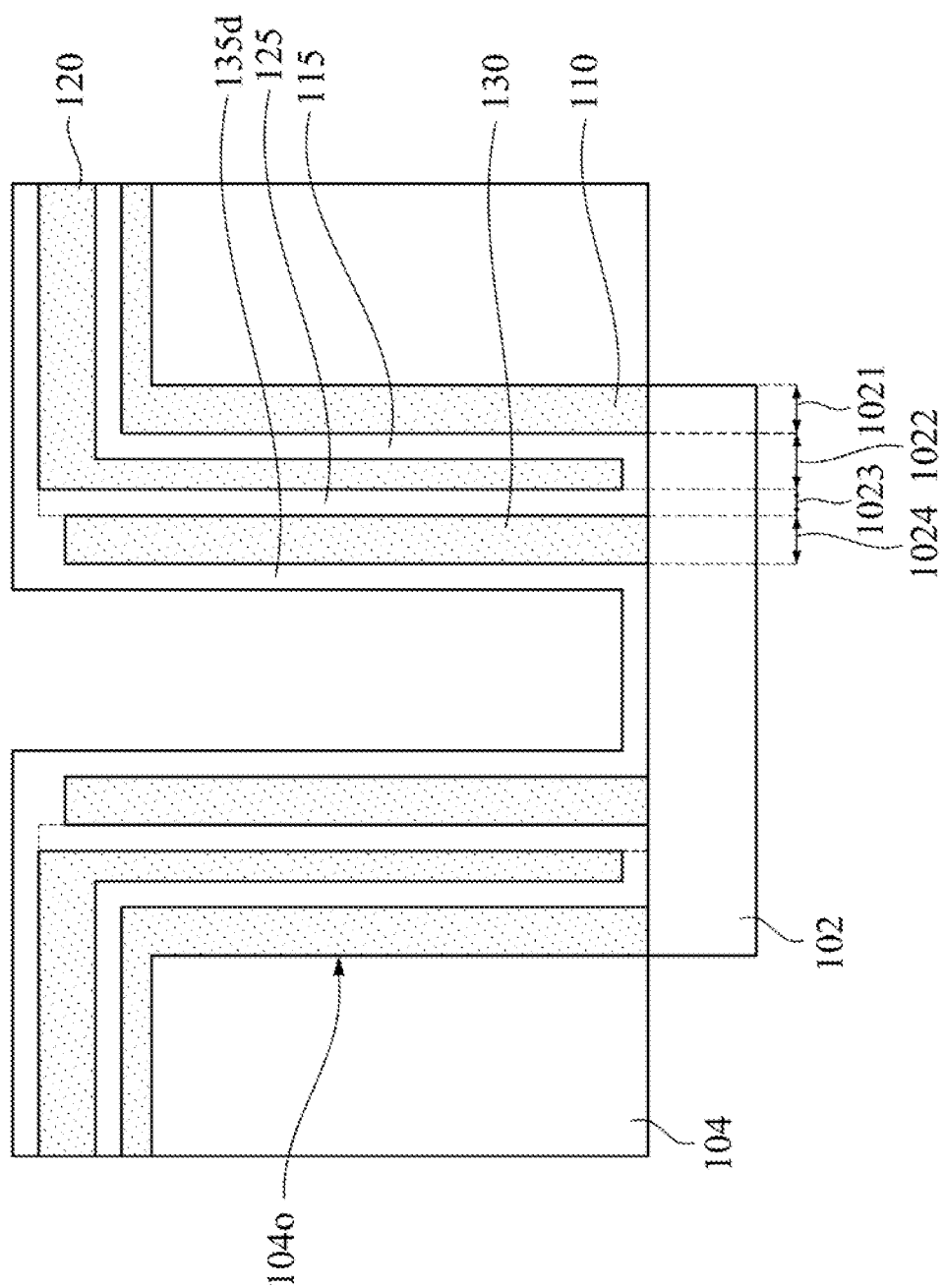

In some embodiments, forming the third dielectric layer 135 and the fourth conductive layer 140 includes: conformally forming a third dielectric material layer 135*d* on the third conductive layer 130, the second dielectric layer 125 and the second conductive layer 120, as shown in FIGS. 8 and 9; performing a polishing process on the third dielectric material layer 135*d* to expose an upper surface of the second dielectric layer 125 and an upper surface of the second conductive layer 120, as shown in FIGS. 9 and 10; conformally forming a fourth conductive material layer 140*c* on the third dielectric material layer 135*d*, the second dielectric layer 125 and the second conductive layer 120 after performing the polishing process, as shown in FIGS. 10 and 11; and removing a portion of the fourth conductive material layer 140*c* and a portion of the third dielectric material layer 135*d* therebeneath (e.g., by performing photolithographic and etching processes) to form the third dielectric layer 135 and the fourth conductive layer 140, as shown in FIGS. 11 and 12.

Figure 13:
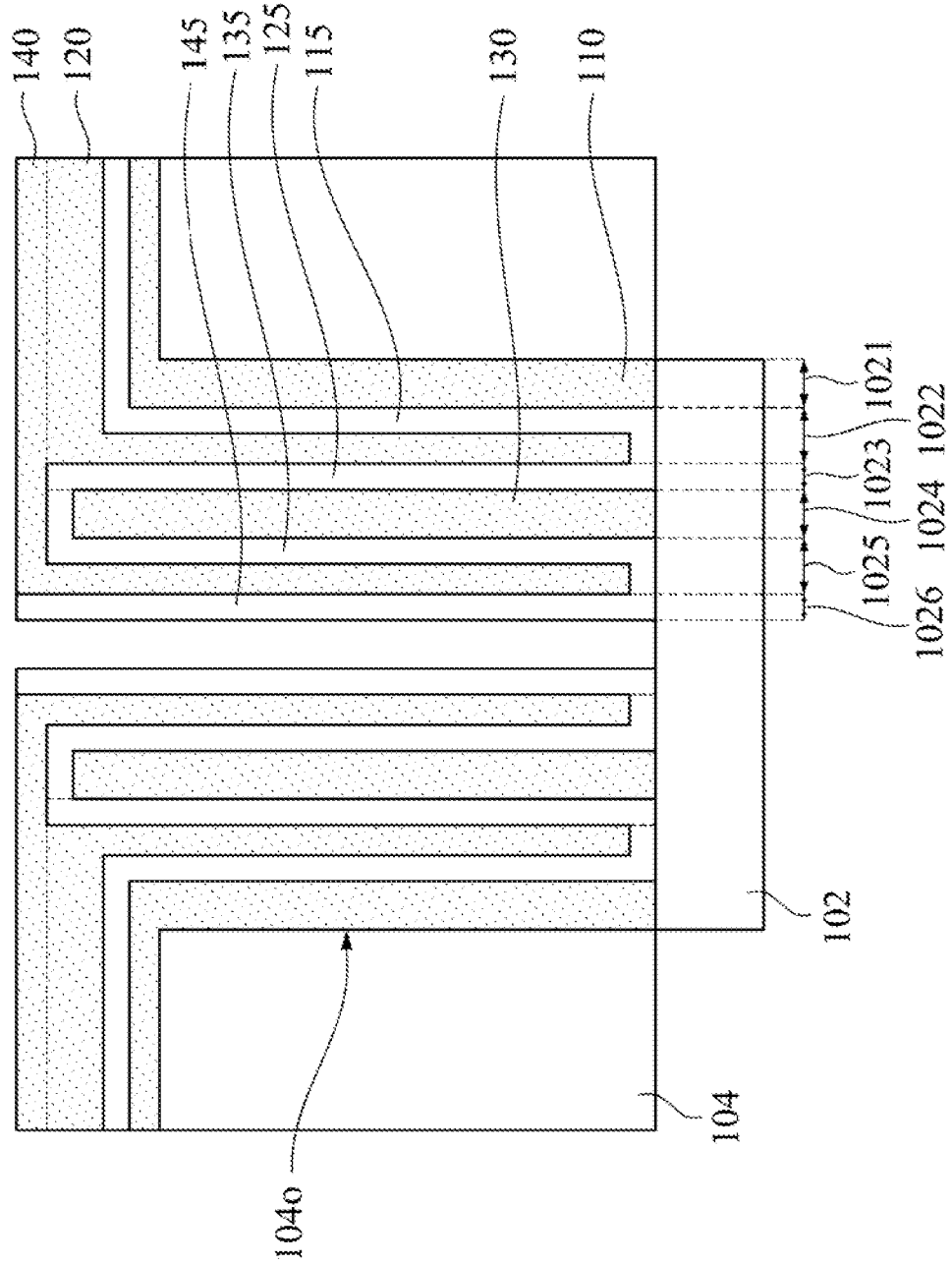

As shown in FIGS. 12 and 13, a fourth dielectric layer 145 is formed on a side surface of the fourth conductive layer 140 and in contact with a sixth portion 1026 of the contact layer 102. The sixth portion 1026 is adjacent to the fifth portion 1025. The fourth dielectric layer 145 is connected to the third dielectric layer 135.

In some embodiments, formation of the fourth dielectric layer 145 is similar to that of the second dielectric layer 125. In some embodiments, forming the fourth dielectric layer 145 includes: conformally forming a fourth dielectric material layer (not shown) on the fourth conductive layer 140; and removing a plurality portions of the fourth dielectric material layer to form the fourth dielectric layer 145. In some embodiments, after the fourth dielectric material layer is formed, a photoresist (not shown) is conformally formed on the fourth dielectric material layer, and an anisotropic etching process in a direction perpendicular to the plane of the contact layer 102 is performed to remove the portions of the fourth dielectric material layer to form the fourth dielectric layer 145.

Figure 14:
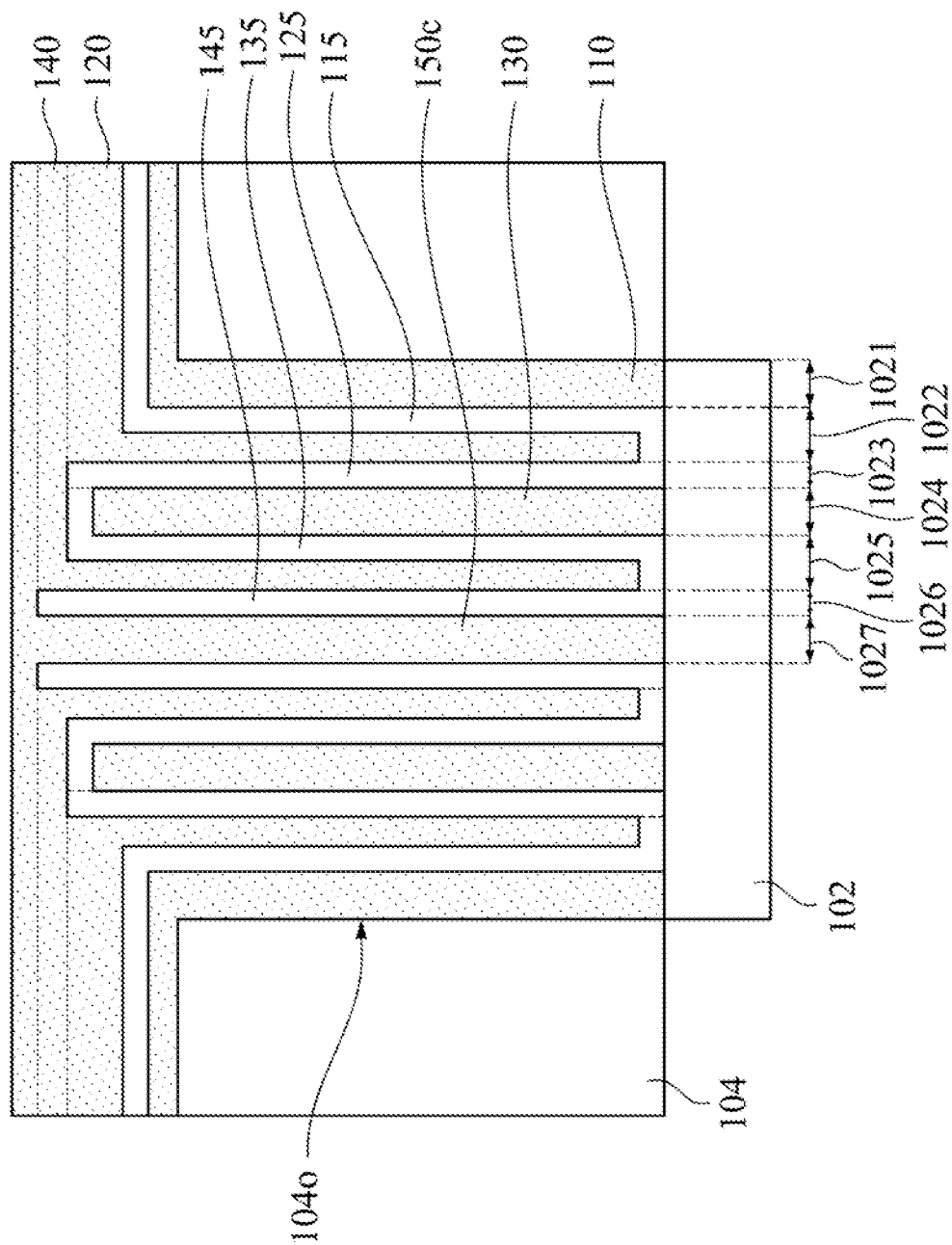
Figure 15:
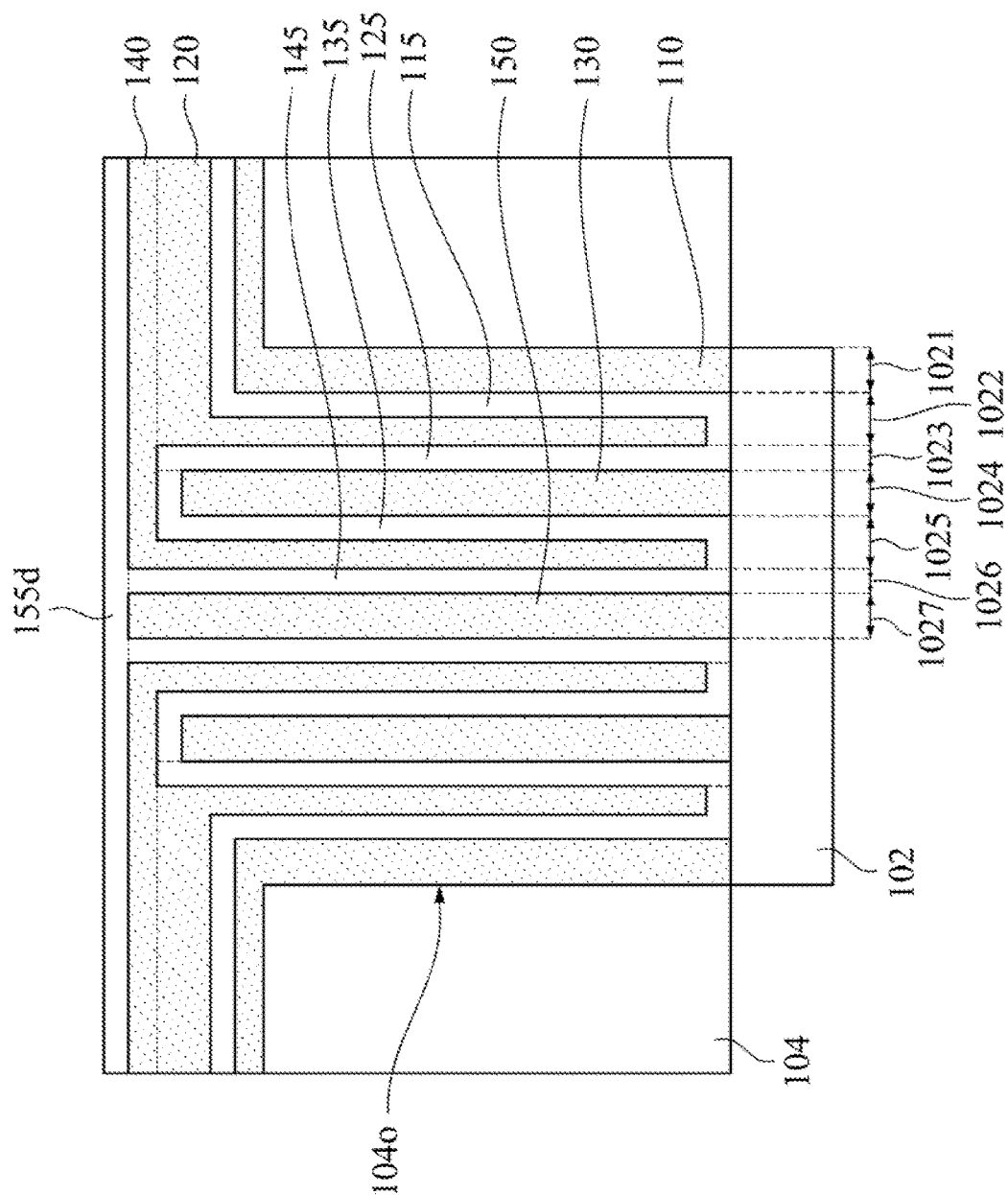

As shown in FIGS. 13-15, a fifth conductive layer 150 is formed on a side surface of the fourth dielectric layer 145 and in contact with a seventh portion 1027 of the contact layer 102. The seventh portion 1027 is adjacent to the sixth portion 1026. As shown in FIG. 15, the first portion 1021, the second portion 1022, the third portion 1023, the fourth portion 1024, the fifth portion 1025, the sixth portion 1026 and the seventh portion 1027 of the contact layer 102 are arranged from periphery to center.

In some embodiments, forming the fifth conductive layer 150 includes: conformally forming a fifth conductive material layer 150*c* on the fourth dielectric layer 145 and the fourth conductive layer 140, as shown in FIGS. 13 and 14; performing a polishing process on the fifth conductive material layer 150*c* to form the fifth conductive layer 150, as shown in FIGS. 14 and 15. In some embodiments, the fifth conductive layer 150 has a height substantially equal to a height of the fourth conductive layer 140, as shown in FIG. 15. In some embodiments, the fifth conductive layer 150 has a height greater than a height of the third conductive layer 130.

Figure 16:
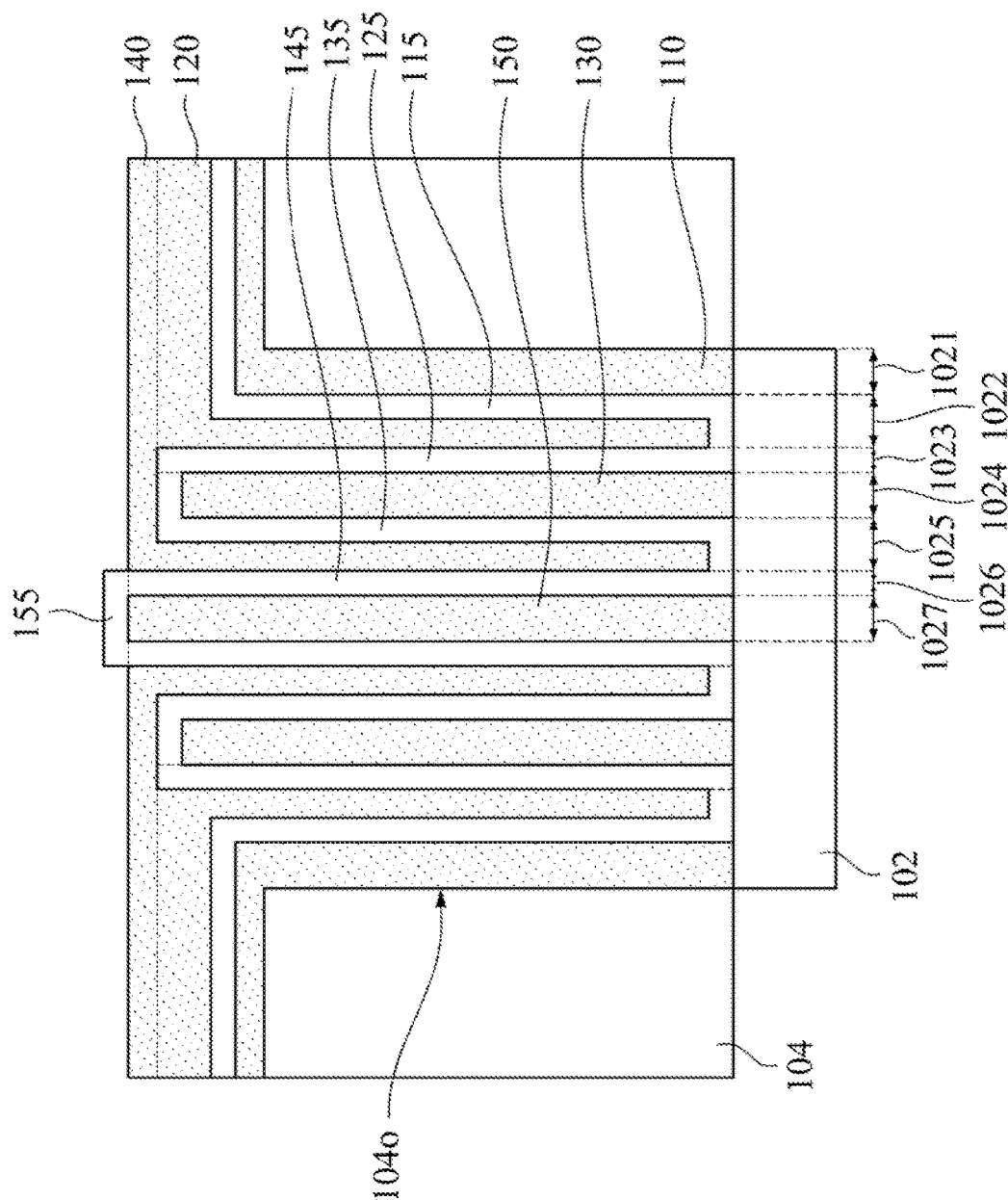

As shown in FIGS. 15 and 16, a fifth dielectric layer 155 is formed on an upper surface of the fourth dielectric layer 145 and an upper surface of the fifth conductive layer 150. The fifth dielectric layer 155 is connected to the fourth dielectric layer 145.

In some embodiments, forming the fifth dielectric layer 155 includes: conformally forming a fifth dielectric material layer 155*d* on the fifth conductive layer 150, the fourth dielectric layer 145 and the fourth conductive layer 140, as shown in FIG. 15; performing photolithographic and etching processes on the fifth dielectric material layer 155*d* to form the fifth dielectric layer 155, as shown in FIGS. 15 and 16.

In some embodiments, the first, second, third, fourth and fifth dielectric layers 115, 125, 135, 145 and 155 constitute a wave-shaped dielectric layer 100*d* in cross-section.

Figure 17:
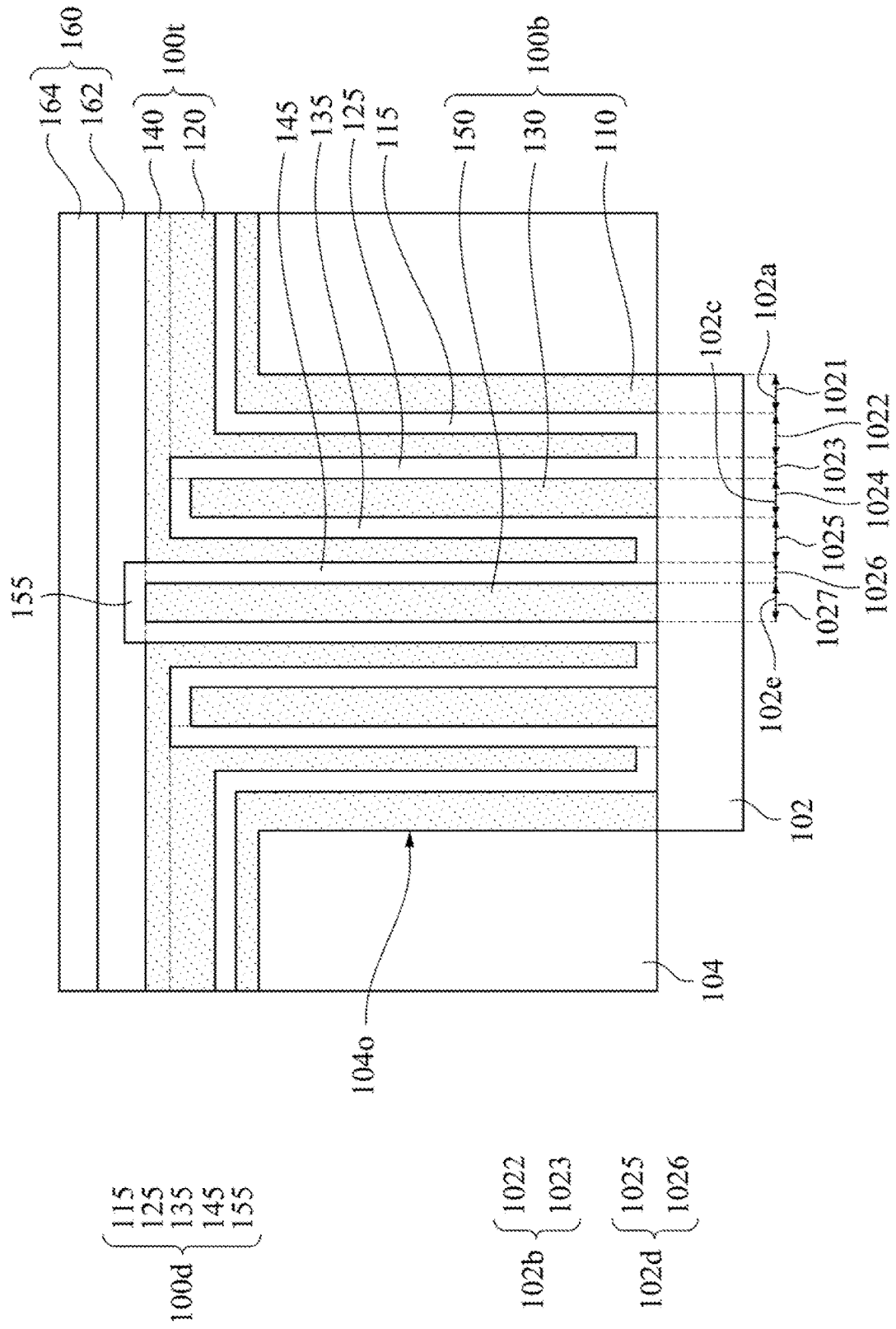

In some embodiments, as shown in FIGS. 16 and 17, the method further includes: forming a semiconductor layer 162 over the fourth conductive layer 140 and the fifth dielectric layer 155; and forming a metal-containing layer 164 over the semiconductor layer 162.

In some embodiments, formations of the first, second, third, fourth and fifth conductive material layers, the first, second, third, fourth and fifth dielectric material layers, the semiconductor layer and the metal-containing layer may include any suitable deposition method, such as coating, atomic layer deposition (ALD), plasma-enhanced atomic layer deposition (PEALD), chemical vapor deposition (CVD), plasma-enhanced chemical vapor deposition (PECVD), low pressure chemical vapor deposition (LPCVD), physical vapor deposition (PVD) (e.g., sputtering), and the like, but not limited thereto.

Figure 19:
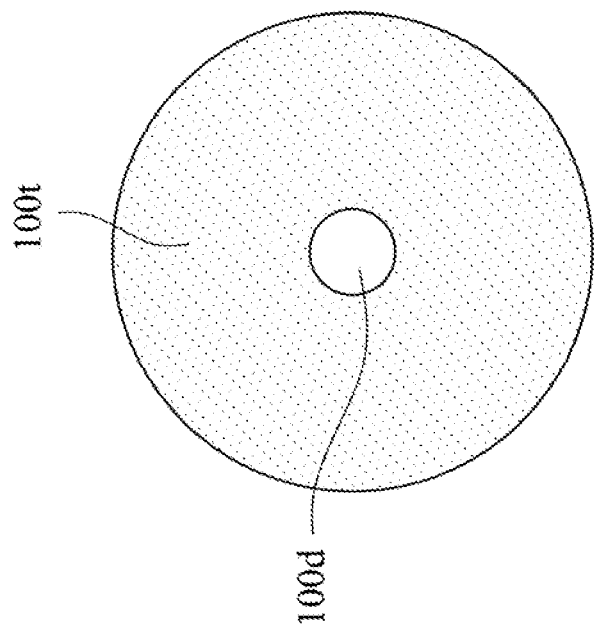
FIG. 19 is a top view of a capacitor structure in accordance with some embodiments of the present disclosure.
Figure 18:
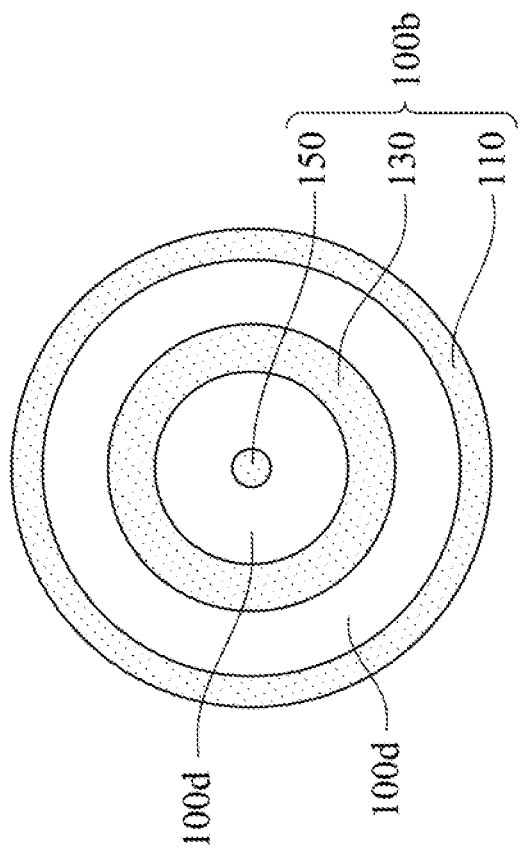
FIG. 18 is a bottom view of a capacitor structure in accordance with some embodiments of the present disclosure.

The present disclosure also provides the single-sided capacitor structure with parallel connection, which has great capacitance value. FIG. 17 is a cross-sectional view of a capacitor structure in accordance with some embodiments of the present disclosure. FIG. 18 is a bottom view of a capacitor structure in accordance with some embodiments of the present disclosure. FIG. 19 is a top view of a capacitor structure in accordance with some embodiments of the present disclosure.

As shown in FIGS. 17-19, the capacitor structure includes a contact layer 102, an insulating layer 104, a bottom conductive plate 100b, a dielectric layer 100d and a top conductive plate 100t.

As shown in FIG. 17, the contact layer 102 has first, second, third, fourth and fifth portions 102a, 102b, 102c, 102d, 102e arranged from periphery to center. In some embodiments, the contact layer 102 includes doped polysilicon (Si), tungsten (W), tungsten silicide (WSi), aluminum (Al), titanium (Ti), titanium nitride (TiN), cobalt (Co) or a combination thereof, but the disclosure is not limited thereto.

As shown in FIG. 17, the insulating layer 104 is disposed over the contact layer 102 and has an opening 104o exposing the contact layer 102. In some embodiments, the shape of the opening 104o in a top view is circular, elliptical or any other suitable shape. In some embodiments, the insulating layer 104 includes silicon nitride, silicon oxynitride, silicon carbide, silicon carbon nitride, or a combination thereof, but the disclosure is not limited thereto.

As shown in FIG. 17, the bottom conductive plate 100b is disposed in the opening 104o and includes first, second and third portions 110, 130 and 150 extending along a depth direction of the opening 140o and separated from each other and in contact with the first, third and fifth portions 102a, 102c and 102e of the contact layer 102, respectively.

In some embodiments, as shown in FIG. 17, the third portion 150 of the bottom conductive plate 100b has a height greater than a height of the second portion 130 of the bottom conductive plate 100b. In some embodiments, as shown in FIG. 17, the second portion 130 of the bottom conductive plate 100b has a height greater than a height of the first portion 110 of the bottom conductive plate 100b.

In some embodiments, as shown in FIG. 18, the first portion 110 of the bottom conductive plate 100b surrounds the second portion 130 of the bottom conductive plate 100b, and the second portion 130 of the bottom conductive plate 100b surrounds the third portion 150 of the bottom conductive plate 100b.

In some embodiments, the bottom conductive plate 100b includes a metal-containing material, such as titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material or a combination thereof, but the disclosure is not limited thereto.

As shown in FIG. 17, the dielectric layer 110d is conformally disposed on the bottom conductive plate 100b and in contact with the second and fourth portions 102b and 102d of the contact layer 102. In some embodiments, the dielectric layer 110d includes silicon nitride, silicon oxynitride, silicon carbide, silicon carbon nitride, or a combination thereof, but the disclosure is not limited thereto.

In some embodiments, as shown in FIG. 17, the dielectric layer 100d is in contact with upper surfaces and side surfaces of the first, second and third portions 110, 130 and 150 of the bottom conductive plate 100b. In some embodiments, the dielectric layer 100d is wave-shaped in cross-section.

As shown in FIG. 17, the top conductive plate 100t is disposed on the dielectric layer 100d. In some embodiments, the top conductive plate 100t includes first and second portions 120 and 140 extending along the depth direction of the opening 104o and toward the second and fourth portions 102b and 102d of the contact layer 102, respectively. In some embodiments, the third portion 150 of the bottom conductive plate 100b has a height substantially equal to a height of the top conductive plate 100t.

In some embodiments, the top conductive plate 100t includes a metal-containing material, such as Ti, Ta, W, Al, Zr, Hf, TiAl, TaAl, WAl, ZrAl, HfAl, TiN, TaN, TiSiN, TaSiN, WSiN, TiC, TaC, TiAlC, TaAlC, TiAlN, TaAlN, any other suitable metal-containing material or a combination thereof, but the disclosure is not limited thereto.

In some embodiments, the capacitor structure further includes a conductive layer 160 over the top conductive plate 100t, in which the dielectric layer 100d on the third portion 150 of the bottom conductive plate 100b is embedded in the conductive layer 160.

In some embodiments, the conductive layer 160 includes a semiconductor layer 162 and a metal-containing layer 164 on the semiconductor layer 162, and the dielectric layer 100d on the third portion 150 of the bottom conductive plate 100b is embedded in the semiconductor layer 162.

In some embodiments, the semiconductor layer 162 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof, but the disclosure is not limited thereto.

In some embodiments, the metal-containing layer 164 includes a metal-containing material, such as Ti, Ta, W, Al, Zr, Hf, TiAl, TaAl, WAl, ZrAl, HfAl, TiN, TaN, TiSiN, TaSiN, WSiN, TiC, TaC, TiAlC, TaAlC, TiAlN, TaAlN, any other suitable metal-containing material or a combination thereof, but the disclosure is not limited thereto.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A method of manufacturing a capacitor structure, comprising:
   forming a first conductive layer on a side surface of an opening exposing a contact layer, wherein the first conductive layer is in contact with a first portion of the contact layer;
   forming a first dielectric layer on an upper surface of the first conductive layer and a side surface thereof and in contact with a second portion of the contact layer, and forming a second conductive layer on an upper surface of the first dielectric layer and a side surface thereof, wherein the second conductive layer and the contact layer are separated by the first dielectric layer;
   forming a second dielectric layer on a side surface of the second conductive layer and in contact with a third portion of the contact layer, wherein the second dielectric layer is connected to the first dielectric layer;
   forming a third conductive layer on a side surface of the second dielectric layer and in contact with a fourth portion of the contact layer, wherein the third conductive layer has a height less than a height of the second dielectric layer;
   forming a third dielectric layer on an upper surface of the third conductive layer and a side surface thereof and in contact with a fifth portion of the contact layer, and forming a fourth conductive layer on an upper surface of the third dielectric layer and a side surface thereof and in contact with the second conductive layer, wherein the third dielectric layer is connected to the second dielectric layer, and the fourth conductive layer and the contact layer are separated by the third dielectric layer;
   forming a fourth dielectric layer on a side surface of the fourth conductive layer and in contact with a sixth portion of the contact layer, wherein the fourth dielectric layer is connected to the third dielectric layer;
   forming a fifth conductive layer on a side surface of the fourth dielectric layer and in contact with a seventh portion of the contact layer; and
   forming a fifth dielectric layer on an upper surface of the fourth dielectric layer and an upper surface of the fifth conductive layer, wherein the fifth dielectric layer is connected to the fourth dielectric layer,
   wherein the first, second, third, fourth, fifth, sixth and seventh portions of the contact layer are arranged from periphery to center; and
   wherein the second conductive layer, the second dielectric layer, the third conductive layer, the third dielectric layer, the fourth conductive layer, the fourth dielectric layer, the fifth conductive layer, and the fifth dielectric layer are sequentially formed.

2. The method of claim 1, wherein forming the third dielectric layer and the fourth conductive layer comprises:
   conformally forming a third dielectric material layer on the third conductive layer, the second dielectric layer and the second conductive layer;
   performing a polishing process on the third dielectric material layer to expose an upper surface of the second dielectric layer and an upper surface of the second conductive layer;
   conformally forming a fourth conductive material layer on the third dielectric material layer after performing the polishing process; and
   removing a portion of the fourth conductive material layer and a portion of the third dielectric material layer therebeneath to form the third dielectric layer and the fourth conductive layer.

3. The method of claim 1, further comprising:
   forming a semiconductor layer over the fourth conductive layer and the fifth dielectric layer; and
   forming a metal-containing layer over the semiconductor layer.

4. The method of claim 1, wherein the fifth conductive layer has a height substantially equal to a height of the fourth conductive layer.

5. The method of claim 1, wherein the fifth conductive layer has a height greater than a height of the third conductive layer.

6. The method of claim 1, wherein the third conductive layer has a height greater than a height of the first conductive layer.

7. A method of manufacturing a capacitor structure, comprising:
   forming a first conductive layer on a side surface of an opening exposing a contact layer, wherein the first conductive layer is in contact with a first portion of the contact layer;
   forming a first dielectric layer on an upper surface of the first conductive layer and a side surface thereof and in contact with a second portion of the contact layer, and forming a second conductive layer on an upper surface of the first dielectric layer and a side surface thereof, wherein the second conductive layer and the contact layer are separated by the first dielectric layer;
   forming a second dielectric layer on a side surface of the second conductive layer and in contact with a third portion of the contact layer, wherein the second dielectric layer is connected to the first dielectric layer;
   forming a third conductive layer on a side surface of the second dielectric layer and in contact with a fourth portion of the contact layer, wherein the third conductive layer has a height less than a height of the second dielectric layer;
   forming a third dielectric layer on an upper surface of the third conductive layer and a side surface thereof and in contact with a fifth portion of the contact layer, and forming a fourth conductive layer on an upper surface of the third dielectric layer and a side surface thereof and in contact with the second conductive layer, wherein the third dielectric layer is connected to the second dielectric layer, and the fourth conductive layer and the contact layer are separated by the third dielectric layer;
   forming a fourth dielectric layer on a side surface of the fourth conductive layer and in contact with a sixth portion of the contact layer, wherein the fourth dielectric layer is connected to the third dielectric layer;
   forming a fifth conductive layer on a side surface of the fourth dielectric layer and in contact with a seventh portion of the contact layer; and
   forming a fifth dielectric layer on an upper surface of the fourth dielectric layer and an upper surface of the fifth conductive layer, wherein the fifth dielectric layer is connected to the fourth dielectric layer, wherein the first, second, third, fourth, fifth, sixth and seventh portions of the contact layer are arranged from periphery to center; and wherein forming the first dielectric layer and the second conductive layer comprises:
- sequentially and conformally forming a first dielectric material layer and a second conductive material layer in the opening and on the first conductive layer; and
- removing a portion of the second conductive material layer and a portion of the first dielectric material layer therebeneath to form the first dielectric layer and the second conductive layer.

8. A method of manufacturing a capacitor structure, comprising:
- forming a first conductive layer on a side surface of an opening exposing a contact layer, wherein the first conductive layer is in contact with a first portion of the contact layer;
- forming a first dielectric layer on an upper surface of the first conductive layer and a side surface thereof and in contact with a second portion of the contact layer, and forming a second conductive layer on an upper surface of the first dielectric layer and a side surface thereof, wherein the second conductive layer and the contact layer are separated by the first dielectric layer;
- forming a second dielectric layer on a side surface of the second conductive layer and in contact with a third portion of the contact layer, wherein the second dielectric layer is connected to the first dielectric layer;
- forming a third conductive layer on a side surface of the second dielectric layer and in contact with a fourth portion of the contact layer, wherein the third conductive layer has a height less than a height of the second dielectric layer;
- forming a third dielectric layer on an upper surface of the third conductive layer and a side surface thereof and in contact with a fifth portion of the contact layer, and forming a fourth conductive layer on an upper surface of the third dielectric layer and a side surface thereof and in contact with the second conductive layer, wherein the third dielectric layer is connected to the second dielectric layer, and the fourth conductive layer and the contact layer are separated by the third dielectric layer;
- forming a fourth dielectric layer on a side surface of the fourth conductive layer and in contact with a sixth portion of the contact layer, wherein the fourth dielectric layer is connected to the third dielectric layer;
- forming a fifth conductive layer on a side surface of the fourth dielectric layer and in contact with a seventh portion of the contact layer; and
- forming a fifth dielectric layer on an upper surface of the fourth dielectric layer and an upper surface of the fifth conductive layer, wherein the fifth dielectric layer is connected to the fourth dielectric layer, wherein the first, second, third, fourth, fifth, sixth and seventh portions of the contact layer are arranged from periphery to center; and wherein forming the third conductive layer comprises:
- conformally forming a third conductive material layer on the second dielectric layer and the second conductive layer;
- performing a polishing process on the third conductive material layer to expose an upper surface of the second dielectric layer and an upper surface of the second conductive layer; and
- removing a plurality of portions of the third conductive material layer to form the third conductive layer having the height less than the height of the second dielectric layer.

* * * * *